US006440213B1

(12) United States Patent
Alivisatos et al.

(10) Patent No.: US 6,440,213 B1
(45) Date of Patent: Aug. 27, 2002

(54) PROCESS FOR MAKING SURFACTANT CAPPED NANOCRYSTALS

(75) Inventors: A Paul Alivisatos; Joerg Rockenberger, both of Berkeley, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/702,219

(22) Filed: Oct. 30, 2000

Related U.S. Application Data
(60) Provisional application No. 60/162,299, filed on Oct. 28, 1999.

(51) Int. Cl.⁷ .............................................. C30B 7/06
(52) U.S. Cl. ........................... 117/68; 117/69; 117/70; 117/75; 117/921; 117/947
(58) Field of Search ............................ 117/68, 69, 70, 117/75, 947, 921

(56) References Cited

U.S. PATENT DOCUMENTS

| | | | | |
|---|---|---|---|---|
| 5,641,424 A | * | 6/1997 | Ziolo et al. | 252/67 |
| 5,667,716 A | * | 9/1997 | Ziolo et al. | 252/62.52 |
| 5,667,924 A | * | 9/1997 | Ziolo et al. | 430/39 |
| 5,714,536 A | * | 2/1998 | Ziolo et al. | 524/530 |
| 5,885,657 A | * | 3/1999 | Penth | 427/372.2 |

OTHER PUBLICATIONS

Rockenberger et al., "A new nonhydrolytic single–precursor apporach to surfactant–capped nanocrystals of transition Metal oxides" J. Am Chem Soc. 1999 vol. 121 pp. 11595–11596.*
Bentzon, M.D. Et Al, "Ordered aggregates of ultrafine iron oxide particles; 'super crystals'," Philosophical Magazine B, vol. 60 (No. 2), p. 169–178, (1989).
Shmakov, A.N. Et Al, "Vacancy Ordering in Gamma Fe2O3:Synchrotron X–ray Powder Diffraction and High–Resolution Electron Microscopy Studies," J. Appl. Cryst., vol. 28, p. 141–145, (1995).
Murray, C.B. Et Al, "Synthesis and Characterization of Nearly Monodisperse CdE (E=S, Se, Te) Semiconductor Nanocrystallites," J. Am. Chem. Soc., vol. 115, p. 8706–8715, (1993).
Fleet, M.E., "The Structure of Magnetite," Acta Cryst., vol. B37, p. 917–920, (1981).

(List continued on next page.)

Primary Examiner—Robert Kunemund
(74) Attorney, Agent, or Firm—Charles R. Nold; Paul Martin

(57) ABSTRACT

Disclosed is a process for making surfactant capped nanocrystals of transition metal oxides. The process comprises reacting a metal cupferron complex of the formula M Cup, wherein M is a transition metal, and Cup is a cupferron, with a coordinating surfactant, the reaction being conducted at a temperature ranging from about 250 to about 300 C., for a period of time sufficient to complete the reaction.

14 Claims, 2 Drawing Sheets

OTHER PUBLICATIONS

Van Der Helm, D. Et Al, "The Crystal Structure of Iron Cupferron Fe(O2N2C6H5)3," Acta Cryst., vol. 18, p. 355–362, (1965).

Tamaki, K. And Okabe, N., "Manganese Cuperronate," Acta Cryst., vol. C52, p. 1612–1614, (1996).

Elerman, Yalcin, "Bis(cupferronato)copper(II), [Cu(C6H5N2O2)2]," Acta Cryst., vol. C51, p. 1520–1522, (1995).

Chemseddine, A. and Weller, H., "Highly Monodisperse Quantum Sized CdS particles by Size Selective Precipitation," Ber. Bunsenges Phys. Chem., vol. 97 (No. 4), p. 636–637, (1993).

Murray, C.B. Et Al, "Self–Organization of CdSe Nanocrystallites into Three–Dimensional Quantum Dot Superlattices," Science, vol. 270, p. 1335–1338, (Nov. 24, 1995).

Ziolo, R.F. Et Al. "Matrix–Mediated Synthesis of Nanocrystalline Gamma–Fe2O3: A New Optically Transparent Magnetic Material," Science, vol. 257, p. 219–223, (Jul. 10, 1992).

Matijevic, Egon, "Preparation and Properties of Uniform Size Colloids," Chem. Mater., vol. 5, p. 412–426, (1993).

Kellner, R. Und Prokopowski, P., "Infrarotspektroskopische Untersuchungen an Metallcupferronaten im Bereich 4000—32 cm(−10)," Analytica Chimica Acta, vol. 86, p. 175–184, (1976).

Sun, Shouheng and Murray, C.B., "Synthesis of monodisperse cobalt nanocrystals and their assembly into magnetic superlattices (invited)," J. Appl. Phys., vol. 85 (No. 8), p. 4325–4330, (Apr. 15, 1999).

Trentler, T.J. Et Al, "Synthesis of TiO2 Nanocrystals by Nonhydrolytic Solution–Based Reactions," J. Am. Chem. Soc., vol. 121, p. 1613–1614, (1999).

Peng, X. Et Al, "Kinetics of II–VI and III–V Colloidal Semiconductor Nanocrystal Growth: "Focusing" of Size Distributions," J. Am. Chem. Soc., vol. 120, p. 5343–5344, (1998).

Moumen, N. and Pileni, M.P., "New Syntheses of Cobalt Ferrite Particles in the Range 2–5 nm: Comparison of the Magnetic Properties of the Nanosized Particles in Dispersed Fluid or in Powder Form," Chem. Mater., vol. 8, p. 1128–1134, (1996).

* cited by examiner

PROCESS FOR MAKING SURFACTANT CAPPED NANOCRYSTALS

CROSS REFERENCE TO RELATED APPLICATIONS

This application claims priority based on Provisional patent application Ser. No. 60/162,299, filed Oct. 28, 1999.

STATEMENT REGARDING FEDERAL SPONSORSHIP

The invention described herein arose in the course of, or under, contract No. DE-AC03-SF00098 between the United States Department of Energy and the Regents, University of California for the operation of the Ernest Orlando Lawrence Berkeley National Laboratory.

BACKGROUND OF THE INVENTION

This invention relates to a process for making non-hydrolytic surfactant capped nanocrystals. More particularly, it relates to a process for making non-hydrolytic surfactant capped nanocrystals of transition metal oxides using a single precursor approach, and to the nanocrystals made thereby.

The advent of new methods to prepare semiconductor and metal nanocrystals, specifically the injection of molecular precursors into hot organic surfactants, has yielded markedly improved samples with good size control, narrow size distributions, and good crystallinity of individual and dispersable nanocrystals.[1-3] It is of considerable interest to apply these methods to the synthesis of transition metal oxide nanoparticles, which typically are prepared by methods involving water as solvent or reactant.[4-9] Using nonhydrolytic preparations of metal oxide nanocrystals at high temperature in organic surfactants, one observes markedly different properties with respect to defect structure and surface composition. So far, there has been only one example of the solution-based nonhydrolytic synthesis of individual $TiO_2$ nanocrystals.[10] Metal oxide nanocrystals with nonhydroxylated surfaces are believed to have significant advantages for applications in catalysis, ceramics, energy storage, magnetic data storage, sensors, ferrofluids, etc.

The following references contain useful background information pertaining to this invention.
1. Murray, C. B.; Norris, D. J.; Bawendi, M. G. J. Am. Chem. Soc. 1993, 115, 8706–8715.
2. Peng, X.; Wickham, J.; Alivisatos, A. P. J. Am. Chem. Soc. 1998, 120, 5343–5344.
3. Sun, S.; Murray, C. J. Appl. Phys. 1999, 85, 4325–4330.
4. Charles, S. W.; Popplewell, J. Ferromagnetic Materials; Northholland Publishing Co.: Amsterdam, N.Y., Oxford, 1982; Vol. 2.
5. Brinker, C. J.; Scherer, G. W. Sol-Gel Science; Academic Press: San Diego, 1990.
6. Ziolo, R. F.; Giannelis, E. P.; Weinstein, B. A.; O'Horo, M. P.; Ganguly, B. N.; Mehrotra, V.; Russell, M. W.; Huffman, D. R. Science 1992, 257, 219–223.
7. Matijevic, E. Chem. Mater. 1993, 5, 412.
8. Moumen, N.; Pileni, M. P. Chem. Mater. 1996, 8, 1128.
9. Ying, J. Y. Special Issue: Sol-Gel Derived Materials. In Chem. Mater. 1997, 9, 2247–2670.
10. Trentler, T. J.; Denier, T. E.; Bertone, J. F.; Agrawal, A.; Colvin, V. L. J. Am. Chem. Soc. 1999, 121, 1613–1614.
11. Comprehensive coordination chemistry: the synthesis, reactions, properties & applications of coordination compounds, 1st ed.; Pergamon Press: Oxford, England, 1987; Vol. 2, Chapter 15.9.2.
12. Helm, D. v. d.; Merritt, L. L.; Degeilh, R.; MacGillavry, C. H. Acta Crystallogr. 1965, 18, 355–362.
13. Elerman, Y.; Atakol, O.; Svoboda, I.; Geselle, M. Acta Crystallogr. C 1995, 51, 1520–1522.
14. Tamaki, K.; Okabe, N. Acta Crystallogr. C 1996, 52, 1612–1614.
15. Kellner, R.; Prokopowski, P. Anal. Chim. Acta 1976, 86, 175–184.
16. Nolze, G.; Kraus, W. Powder Diffr. 1998, 13, 256–259.
17. Shmakov, A. N.; Kryukova, G. N.; Tsybulya, S. V.; Chuvilin, A. L.; Solovyeva, L. P. J. Appl. Crystallogr. 1995, 28, 141.
18. Jarosch, D. Mineral. Petrol. 1987, 37, 15–23.
19. Neuburger, M. C. Z. Phys. 1930, 67, 845–850.
20. Cullity, B. D. Elements of X-ray Diffraction, 2nd ed.; Addison-Wesley: Reading, Mass., 1978.
21. Bentzon, M. D.; Wonterghem, J. v.; Morup, S.; Tholen, A.; Koch, C. J. W. Philos. Mag. B 1989, 60, 169–178.
22. Murray, C. B.; Kagan, C. R.; Bawendi, M. G. Science 1995, 270, 1335–1338.
23. Chemseddine, A.; Weller, H. Ber. Bunsen-Ges. Phys. Chem. 1993, 97, 636–637.
24. Fleet, M. E. Acta Crystallogr. B 1981, 37, 917–920.
25. Cornell, R. M.; Schwertmann, U. The Iron Oxides-Structure, Properties, Reactions, Occurrence and Uses, 1st ed.; VCH Verlagsgesellschaft: Weinheim, Germany, 1996.

SUMMARY OF THE INVENTION

It is an object of this invention to provide a non-hydrolytic process for the preparation of transition metal oxide nanocrystals.

It is a further object of this invention top provide a non-hydrolytic process for the preparation of transition metal oxide nanocrystals having non-hydroxylated surfaces.

It is a still further object of this invention to provide new and novel transition metal oxide nanocrystals.

These, and other objects are achieved by injecting a solution of a metal cupferron complex of the formula M Cup, wherein M is a transition metal, and Cup is a cupferron, into an amine based coordinating surfactant, the injection reaction being conducted at a temperature ranging from about 250 to about 300° C., for a period of time sufficient to complete the reaction.

DETAILED DESCRIPTION OF THE INVENTION

Figure 1:
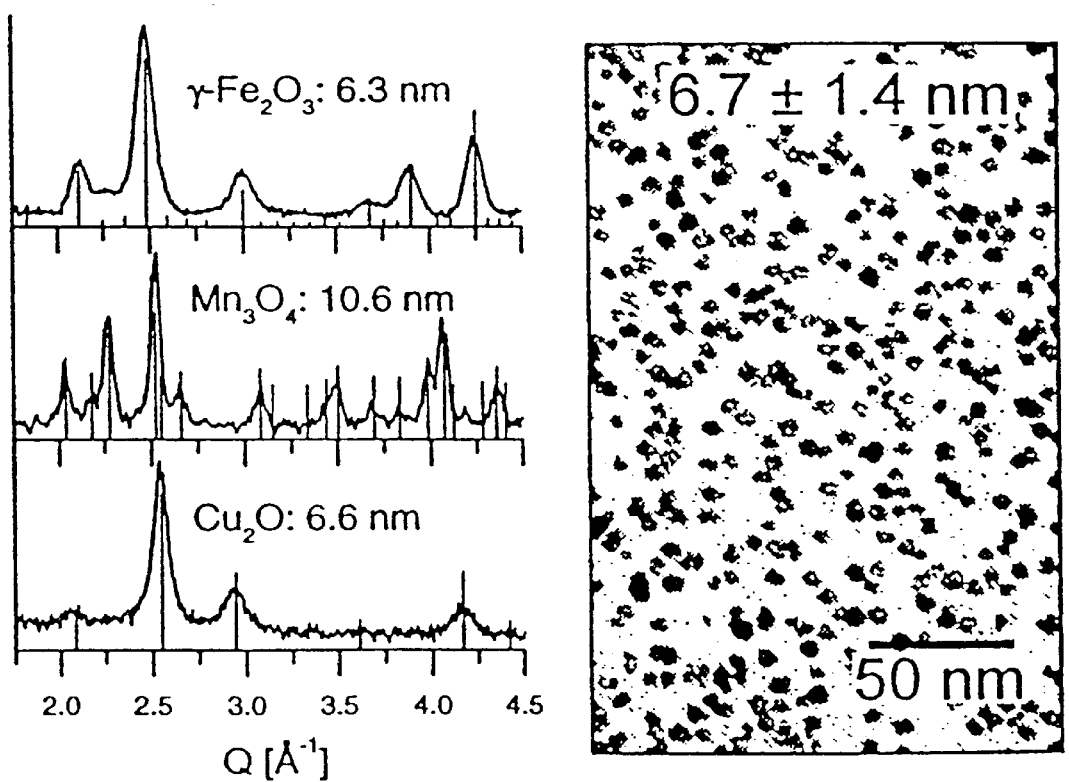
FIG. 1, shows XRD patterns of $\gamma$-$Fe_2O_3$, $Mn_3O_4$, and $Cu_2O$ nanocrystals and expected lattice reflections of the respective bulk phases (left). A low-resolution TEM image of the corresponding sample of $\gamma$-$Fe_2O_3$ nanocrystals is shown at the right.

We have now discovered a new nonhydrolytic single-precursor approach to the synthesis of dispersable nanocrystals of transition metal oxides. Metal Cupferron complexes $M_xCup_x$ (M: metal ion; Cup: N-nitrosophenylhydroxylamine, $C_6H_5N(NO)O-$), with the metal ion coordinated via the oxygen atoms of the Cup ligand in a bidentate manner, proved to be promising as molecular precursors. Metal cupferronates are used in the precipitation or extraction of metal ions from aqueous solution, and are easily prepared for many metal elements.[11] In the following, we demonstrate that injecting solutions of metal Cupferron complexes in octylamine into long-chain amines at 250–300 C. yields nanocrystals of iron oxide, manganese oxide,and copper oxide. These nanocrystals range from 4 to 10 nm in diameter, are crystalline, and are dispersable in organic solvents. As Cupferron complexes are available for almost all metal elements, the use of this precursor offers an interesting general approach to metal oxide nanocrystals.

The preparation of the metal Cupferron precursor is based on the precipitation of metal ions from aqueous solution at a specific pH with Cupferron, the ammonium salt of N-nitrosophenylhydroxylamine. In all three cases ($M_xCup_x$ (M: $Fe^{3+}$, $Cu^{2+}$, $Mn^{2+}$)) the elemental analysis and the powder X-ray diffraction (XRD) patterns agreed well with single-crystal data.[12-14] In addition, FT-IR spectroscopy excluded the presence of excess Cupferron, water, or solvent molecules, and agreed well with results given in the literature.[15]

Dried powders of metal cupferronates show sharp decomposition temperatures of 180, 230, and 205 C. for $FeCup_3$, $MnCup_2$ and $CuCup_2$, respectively, when heated in a DTA/TGA apparatus under nitrogen. XRD of the respective decomposition products reveals that they consist of $\gamma$-$Fe_2O_3$, MnO, and Cu. The latter is a consequence of the reduction of $CuO/Cu_2O$ by the reducing atmosphere given by the organic decomposition products of the Cupferron complex. This result proves that metal Cupferron complexes can indeed act as molecular precursors for transition metal oxides in the absence of $O_2$ and $H_2O$.

In the following, a typical synthesis yielding iron oxide nanocrystals with 6–7 nm particle diameters is described. To remove oxygen and water, 7 g of trioctylamine was heated to 100 C. for 1–1.5 h and repeatedly evacuated to 20 mTorr and purged with Ar. A solution of 0.3 M $FeCup_3$ in octylamine was treated the same way at 60 C. The reaction was initiated by the rapid injection of 4 mL of $FeCup_3$ stock solution into the trioctylamine at 300 C. under vigorous magnetic stirring and an Ar atmosphere. A color change of the solution from colorless to dark-brown and the evolution of gas indicated the decomposition of the metal Cupferron complex. After the solution was heated for 30 min at 225 C., the reaction was stopped and the solution was allowed to cool. At room temperature the flask contained nanocrystals of iron oxide, in both a dark-brown, clear liquid supernatant and a precipitate. The latter results from the high concentration of nanocrystals and their limited solubility in trioctylamine at low temperature. Adding 1–2 mL of organic solvents such as toluene, $CHCl_3$, etc. to this precipitate yielded clear, deep-brown dispersions of iron oxide nanocrystals which were stable for weeks at room temperature. By addition of a 3-fold volume excess of methanol, the iron oxide nanocrystals could be reprecipitated as a brown powder. Adding methanol to the supernatant of the reaction led to a brown precipitate, which could also be redispersed and reprecipitated by suitable solvents. For both fractions, dispersion and reprecipitation could be repeated several times.

Similar procedures were used in the synthesis of manganese oxide and copper oxide nanocrystals. In the case of manganese oxide, an orange precipitate was obtained after the reaction, which changed color to brown upon dispersion in toluene. In the case of $CuCup_2$, hexadecylamine was used as a surfactant to disperse the precipitated nanocrystalline copper oxide in toluene or $CHCl_3$. In addition, the reaction had to be stopped immediately after injection since the formation of metallic Cu instead of the copper oxide is favored at high temperatures under the strongly reducing conditions of the reaction.

Powder XRD reveals the nanocrystal line nature of the samples (FIG. 1, left). The diffraction patterns were fitted with the program PowderCell [16] using structure data for $\gamma$-$Fe_2O_3$, $Mn_3O_4$ and $Cu_2O$ as models.[17-19] Using the Debye-Scherrer equation, [20] a crystallite size was determined for every reflection, and all were averaged to give the mean values reported in FIG. 1 (left). These averaged crystallite sizes are in good agreement with mean diameters determined from low-resolution TEM imaging. The corresponding TEM image of the $\gamma$-$Fe_2O_3$ nanocrystals is shown in FIG. 1 (right). The nanocrystals are individual and their average diameter is 6.7 nm with a standard deviation of 1.4 nm.

Figure 2:
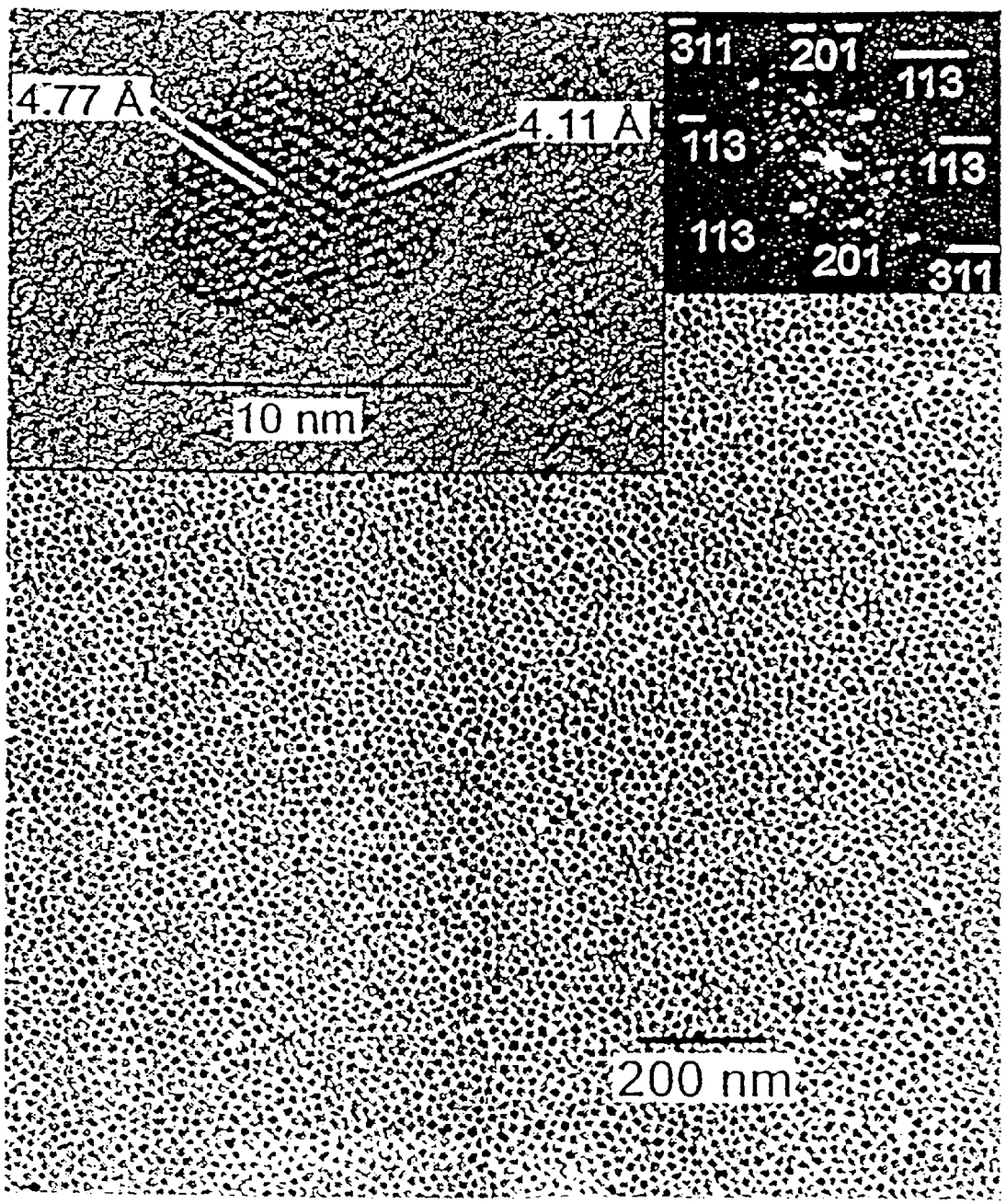
FIG. 2, shows a Low-resolution TEM image of a monolayer of individual—$\gamma$-$Fe_2O_3$ nanocrystals (10.0±1.5 nm) covering an area bigger than 2 $\mu^2$. Top left: High-resolution TEM image of one of the nanocrystals in this sample. The indicated lattice plane distances correspond to the (113) and (201) lattice planes of tetragonal—$\gamma$-$Fe_2O_3$ with ordered superlattice of the cation vacancies. Top right: FET of the high-resolution TEM image looking down the [512] zone-axis.

Particles with average sizes down to 4 nm were synthesized by lowering the injection temperature and/or lowering the injected precursor concentration. For instance, injecting the FeCup3 precursor solution at 250 C. and refluxing at 200 C. for 30 min, instead of 300 and 225 C. as in the sample of FIG. 1, yields $\gamma$-$Fe_2O_3$ nanocrystals 5.2± 1.5 nm in size. However, the injection of an additional 2 mL of precursor solution after 5 min of refluxing at 200 C. results in particles with diameters of 6.1±1.8 nm. In all cases it was observed that subsequent extractions of the reaction precipitate with toluene yielded fractions containing continuously bigger particles. In the case of the preparation with an additional secondary injection, each subsequent extraction of the reaction precipitate resulted in approximately a 1 nm increase in the average particle diameter. Consequently, the fifth fraction contained $\gamma$-$Fe_2O_3$ nanocrystals which were 10.0±1.5 nm in diameter. A low-resolution TEM image of this fraction is shown in FIG. 2. Apparently, the slow evaporation of a dispersion of nanocrystals in toluene on a TEM grid leads to the formation of an extended monolayer of particles. The covered area is larger than $2\mu^2$ and extends beyond the part shown in FIG. 2. Each particle is separated from neighboring particles by its shell of surfactant. Currently, the relatively broad size distribution of 15% prevents the formation of ordered superlattices as observed with other systems.[3,21,22] However, we believe that by using size-selective precipitation, 23 in addition to size-selective extraction during the isolation process, we will be able to achieve size distributions with less than 10% standard deviation.

The crystallinity of these particles is revealed by high-resolution TEM imaging as shown in FIG. 2 (top left). The observed lattice plane distances of 4.77 and 4.11 Å, as well as the angle of about 50 between the crossed fringes, indicate the presence of tetragonal $\gamma$-$Fe_2O_3$ with an ordered superlattice of cation vacancies.[17] The corresponding lattice planes are (113) and (201), respectively, and the FFT (top right) of the high-resolution image indicates that the particle was imaged along its [512] zone axis. Neither cubic—$\gamma$-$Fe_2O_3$ with a statistical distribution of cation vacancies over the octahedral sites nor Fe3O4 shows a similar agreement.[17,24] In other high-resolution TEM images, we observe particles with lattice plane distances of 4.97 and 4.27 Å that also belong uniquely to the tetragonal superstructure phase of—$\gamma$-$Fe_2O_3$ (see table in Supporting Information). Interestingly, it has been reported that this ordered superstructure phase occurs only in particles with diameters larger than 100 nm.$_{25}$.

We have discovered a process to prepare dispersable nanocrystals of transition metal oxides in the absence of water or air by thermal decomposition of metal Cupferron complexes in hot surfactants. Preliminary experiments suggest that a similar level of size control as in the synthesis of semiconductor nanocrystals is possible. Since the precursor is available for many metal elements, this approach may present a rather general route to metal oxide nanocrystals.

Preparation of Metal Cupferron Complexes

The preparation of metal cupferron complexes is based on the precipitation of a metal salt from aqueous solution at a specific pH with cupferron, the respective amonium salt of N-nitroso-phenylhydroxylamine. In case of FeCup$_3$, we followed the procedure as described in literature. 1.12 g__FeCl$_3$.6H$_2$O were dissolved in 280 ml of 1% HCl in H$_2$O. To this solution, 140 ml conc. HCl were added, and this mixture was diluted with 525 ml H$_2$O and cooled in a fridge for about 15 min. Then 3 g cupferron dissolved in 100 ml H$_2$O were added dropwise from a burette yielding a red-brown precipitate. After 15 min of standing, the precipitate was filtered and dissolved in CHCl$_3$. Water was removed in a separation funnel and the resulting deep-red solution was concentrated to about 5–10 ml in a rotavapor and additionally filtered with a glass filter. Hexane was then added until the solution became slightly turbid and the flask was placed into a fridge at −20° C. Within one day, large deep-red crystals grew which were isolated by decanting and dried in vacuum at 40° C. The yield of this product was typically 60–80% with respect to iron.

CuCup$_2$ was prepared by adding dropwise 6 g cupferron dissolved in 200 ml H$_2$O to a solution of 1.54 g CuCl$_2$.H$_2$O in 1.4 l H$_2$O. The resulting blue-gray precipitate was filtered after 15 min and dissolved in pyridine yielding a deep green solution. The solution was concentrated in a rotavapor and filtered with a glass filter. To this solution a mixture of n-butanol and hexane was added until the solution was slightly turbid. After one day in a fridge at −20° C. the solution contained large deep-green crystals which were isolated from the supernatant by decanting and dried at 40° C. under vacuum. The yield of the resulting blue-gray powder was typically 50–70% with respect to copper.

Adding 6 g cupferron dissolved in 200 ml H$_2$O to a solution of 1.80 g MnCl$_2$.4H$_2$O in 700 ml H$_2$O yielded an orange precipitate, which was isolated after 15 min. by filtration. This precipitate was dried at 20 mtorr at room temperature for several hours and the yield was typically about 50% with respect to manganese. Note that redissolving this precipitate with pyridine or THF and precipitating by n-butanol/hexane addition yields an orange precipitate of unknown composition and structure.

Characterization of Metal Cupferron Complexes

Characterization of the dried powders of metal cupferron complexes involved elemental analysis, powder x-ray diffraction and FT-IR spectroscopy. The results of the elemental analysis (calc. values in brackets) are for FeCup$_3$: 12.5% (12.0%) Fe, 46.1% (46.3%) C, 17.5% (18.0%) N, and 3.4% (3.2%) H; for CuCup$_2$: 19% (18.8%) Cu, 43.1% (42.7%) C, 15.8% (16.6%) N, and 3.3% (3.0%) H; for MnCup$_2$: 17.2% (16.2%)Mn, 41.6% (43.8%) C, 16.4% (17.0%) N, 3.27% (3.1%) H.

By washing the precipitate excessively with methanol, the surfactant could be removed yielding typically about 50–60 mg of a brown insoluble powder after drying. This powder still contained about 10% of volatile compounds as indicated by thermal gravimetric analysis between 300 K and 1100 K in an O$_2$ atmosphere. The overall yield of iron oxide is thereby estimated to 45 mg to 55 mg, which corresponds to about 50% of the iron injected as cupferron complex. Note that this estimate represents a lower limit since further extractions of the reaction precipitate with toluene yielded additional fractions of dispersed iron oxide nanocrystals.

We claim:

1. A process for making surfactant capped nanocrystals of transition metal oxides which comprises injecting a solution of a metal cupferron complex of the formula M Cup, wherein M is selected from the group consisting of Fe, Mn, and Cu, and Cup is N-nitroso-phenyl hydroxylamine, into an amine based coordinating surfactant, the injection reaction being conducted at a temperature ranging from about 250 to about 300° C., for a period of time sufficient to complete the reaction.

2. The process of claim 1 wherein said injection reaction is conducted in an inert atmosphere.

3. The process of claim 2 wherein said inert atmosphere is argon gas.

4. The process of claim 1 wherein M is Fe.

5. The process of claim 1 wherein M is Mn.

6. The process of claim 1 wherein M is Cu.

7. The process of claim 1 wherein said coordinating surfactant is trioctylamine.

8. The process of claim 1 wherein said coordinating surfactant is hexadecyl amine.

9. The process of claim 1 wherein said reaction is conducted at atmospheric pressure.

10. The process of claim 1 wherein M is Fe, Cup is N-nitroso-phenyl hydroxylamine, and the coordinating surfactant is trioctylamine.

11. A process for making surfactant capped nanocrystals of transition metal oxides which comprises injecting a solution of a metal cupferron complex of the formula M Cup, wherein M is a transition metal, and Cup is a cupferron, into an amine based coordinating surfactant, said reaction being conducted at a temperature ranging from about 250 to about 300° C., for a period of time sufficient to complete the reaction.

12. A surfactant capped nanocrystal made in accordance with the process of claim 1.

13. A crystalline surfactant capped transition metal oxide nanocrystal ranging from about 4 to about 10 nm in diameter.

14. A process for making surfactant capped nanocrystals of transition metal oxides which comprises injecting a solution of a metal cupferron complex of the formula M Cup, wherein M is selected from the group consisting of Fe, Mn, and Cu, and Cup is N-nitroso-phenyl hydroxylamine, into a coordinating surfactant, the injection reaction being conducted at a temperature ranging from about 250 to about 300° C., for a period of time sufficient to complete the reaction.

* * * * *

UNITED STATES PATENT AND TRADEMARK OFFICE
CERTIFICATE OF CORRECTION

PATENT NO. : 6,440,213 B1  
APPLICATION NO. : 09/702219  
DATED : August 27, 2002  
INVENTOR(S) : A. Paul Alivisatos and Joerg Rockenberger It is certified that error appears in the above-identified patent and that said Letters Patent is hereby corrected as shown below:

Col. 1, line 10, insert the following

STATEMENT REGARDING FEDERAL SPONSORSHIP after "The invention described herein arose in the course of, or under," add -- U.S. Government support from the Air Force Office of Scientific Research under Grant No. F49620-98-1-0243 and --

Signed and Sealed this
Twenty-seventh Day of September, 2011

David J. Kappos
*Director of the United States Patent and Trademark Office*